(12) United States Patent
Park et al.

(10) Patent No.: US 7,583,540 B2
(45) Date of Patent: Sep. 1, 2009

(54) FLASH MEMORY DEVICE AND METHOD OF PROGRAMMING THE SAME

(75) Inventors: Ki-Tae Park, Gyeonggi-do (KR); Jung-Dal Choi, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 40 days.

(21) Appl. No.: 11/855,978

(22) Filed: Sep. 14, 2007

(65) Prior Publication Data

US 2008/0074923 A1    Mar. 27, 2008

(30) Foreign Application Priority Data

Sep. 22, 2006    (KR) ...................... 10-2006-0092464

(51) Int. Cl.
*G11C 16/04* (2006.01)

(52) U.S. Cl. ............................ 365/185.33; 365/185.18; 365/185.17

(58) Field of Classification Search ............ 365/185.33, 365/185.18, 185.17
See application file for complete search history.

(56) References Cited

U.S. PATENT DOCUMENTS

| | | | |
|---|---|---|---|
| 5,867,429 | A | 2/1999 | Chen et al. |
| 6,061,270 | A | 5/2000 | Choi |
| 6,522,585 | B2 | 2/2003 | Pasternak |
| 6,807,095 | B2 | 10/2004 | Chen et al. |
| 6,987,693 | B2 | 1/2006 | Cernea et al. |
| 7,372,715 | B2 * | 5/2008 | Han .............................. 365/63 |

FOREIGN PATENT DOCUMENTS

| | | |
|---|---|---|
| JP | 9-180473 | 7/1997 |
| KR | 10-1997-0011716 | 7/1997 |
| KR | 10-2004-0082534 | 9/2004 |
| KR | 10-2005-0112991 | 12/2005 |
| KR | 10-2006-0031989 | 4/2006 |

OTHER PUBLICATIONS

English language abstract of Japanese Publication No. 9-180473.
English language abstract of Korean Publication No. 10-2004-0082534.
English language abstract of Korean Publication No. 10-2005-0112991.
English language abstract of Korean Publication No. 10-2006-0031989.

* cited by examiner

*Primary Examiner*—Huan Hoang
(74) *Attorney, Agent, or Firm*—Marger Johnson & McCollom, P.C.

(57) ABSTRACT

A flash memory device and a method of programming the same are disclosed. The flash memory device includes an array of memory cells intersected by a plurality of bit lines and a plurality of word lines. A page buffer circuit includes a plurality of latches coupled to an even virtual bit line and an odd virtual bitline. The page buffer circuit is configured to load data into the array of memory cells responsive to a select circuit, which is structured to electrically couple at least some of the bit lines to the plurality of latches of the page buffer circuit.

20 Claims, 10 Drawing Sheets

FLASH MEMORY DEVICE AND METHOD OF PROGRAMMING THE SAME

CROSS-REFERENCE TO RELATED APPLICATIONS

This U.S. non-provisional patent application claims priority under 35 U.S.C. § 119 of Korean Patent Application No. 10-2006-92464, filed on Sep. 22, 2006, the entire contents of which are hereby incorporated by reference.

BACKGROUND OF THE INVENTION

The present invention disclosed herein relates to a semiconductor memory device, and more particularly, to a flash memory device capable of reducing charge coupling that occurs between adjacent memory cells coupled to the same row, and a method of programming the same.

A semiconductor memory device is largely classified into a volatile semiconductor memory device and a non-volatile semiconductor memory device. The volatile semiconductor memory device is characterized of fast reading and writing speeds, but has limitations of losing stored content when no power is applied. Contrarily, the non-volatile semiconductor memory device retains the stored content even if no power is applied. Therefore, the non-volatile memory device is used for storing content that must remain regardless of power. The non-volatile memory device includes a mask read-only memory (MROM), a programmable read-only memory (PROM), an erasable programmable read-only memory (EPROM), an electrically erasable programmable read-only memory (EEPROM), etc. Since a flash EEPROM (hereinafter, referred to as a flash memory) among non-volatile semiconductor memory devices has the higher degree of integration, compared to a typical EEPROM, it is advantageous to use the flash memory for a high capacity auxiliary memory device.

FIG. 1 shows an array structure including a conventional flash memory device. FIG. 2 shows a vertical sectional view including memory cells 40, 50, and 60 arranged in the same row of FIG. 1.

Referring to FIGS. 1 and 2, a memory cell array 10 may include a plurality of memory blocks including a plurality of bit lines BL1e, BL1o, BL2e, . . . BLmo, which are arranged in parallel. Each memory block may include a plurality of NAND strings corresponding to the respective bit lines BL1e, BL1o, BL2e, . . . BLmo. One memory block in the memory cell array 10 is illustrated as an example in FIG. 1.

Each string may have a string select transistor SST and a ground select transistor GST. A plurality of floating gate transistors M0 to M31 (hereinafter, referred to as memory cells) used for memory cells may be coupled in series between the string select transistor SST and the ground select transistor GST. The memory cells M0 to M31 included in each string may be formed in the same substrate 80. The memory cells M0 to M31 may include adjacent floating gate transistors and shared source-drain terminals in each string. A plurality of word lines WL<0> to WL<31> may intersect each string.

Looking at a structure of adjacent memory cells 40, 50, and 60 coupled to the same row, floating gates 41, 51, and 61, i.e., charge storage elements of the memory cell, may be spaced a predefined distance apart from each other.

A control gate 70 may be formed on the floating gates 41, 51, and 61 of the memory cells 40, 50, and 60. The control gate 70 may also be coupled to the corresponding word line WL<30>.

To program the memory cells, an erase process may be performed to have a predetermined threshold voltage (e.g., −3 V) in the memory cells. Then, a high voltage (e.g., 20 V) may be applied to the word line WL<30> for a predetermined time, which is coupled to a selected memory cell 50. To accurately program the selected memory cell 50, the threshold voltage of the selected memory cell 50 may increase to a higher level, but the threshold voltage of the memory cells 40 and 60 (which are not selected) must stay without change.

When a program voltage is applied to the selected word line WL<30>, the program voltage is commonly supplied to the selected memory cell 50 and unselected memory cells 40 and 60 through the control gate 70. As illustrated in FIG. 2, a parasitic capacitance Cx may be disposed between the adjacent floating gates 41, 51, and 61. Therefore, when the program voltage is applied to the selected word line WL<30>, charge coupling between the selected memory cell 50 and unselected memory cells 40 and 60 occurs due to the parasitic capacitance Cx. Consequently, the threshold voltages of the selected memory cell 50 and unselected memory cells 40 and 60 arise together such that unselected memory cells 40 and 60 adjacent to the selected memory cell 50 are accidentally programmed. At this point, the size of the rising threshold voltage Vth is in proportion to the size (i.e., 2Cx) of the parasitic capacitance Cx between the selected memory 50 and adjacent memory cells 40 and 60.

Due to the change of a threshold voltage in the memory cell, which is caused by charge coupling, an unintended program operation occurs in the unselected memory cell. This is called program disturb. The program disturb in the flash memory device is disclosed in U.S. Pat. No. 5,867,429, entitled "HIGH DENSITY NON-VOLATILE FLASH MEMORY WITHOUT ADVERSE EFFECTS OF ELECTRIC FIELD COUPLING BETWEEN ADJACENT FLOATING GATES." A method of reprogramming a part of memory cells after performing a program operation, which prevents the change of a threshold voltage in the memory cell due to charge coupling, is disclosed in U.S. Pat. No. 6,807,095, entitled "MULTI-STATE NONVOLATILE MEMORY CAPABLE OF REDUCING EFFECTS OF COUPLING BETWEEN STORAGE ELEMENTS." According to the above method, the extensive threshold voltage distribution due to the charge coupling becomes less wide.

However, an additional program operation is required for adjusting the threshold voltage distribution after performing a general program operation disclosed in U.S. Pat. No. 6,807,095. Consequently, a program time lengthens and controls become complicated. To accurately perform a program process, a new method is required to reduce the change of a threshold voltage, which occurs due to the charge coupling caused by adjacent memory cells arranged in the same row, without an additional program operation or an additional circuit.

SUMMARY OF THE INVENTION

The present invention includes a flash memory device capable of reducing charge coupling, which occurs between adjacent memory cells coupled to the same row, and a method of programming the same.

Some embodiments of the present invention include a flash memory device comprising: a memory array intersected by a first even bit line, a first odd bit line adjacent to the first even bit line, a second even bit line, and a second odd bit line adjacent to the second even bit line, and a plurality of word lines; a page buffer circuit including a first latch coupled to an even virtual bit line and a second latch coupled to an odd virtual bit line, the even virtual bit line being coupled to the first and second even bit lines, and the odd virtual bit line being coupled to the first and second odd bit lines; and a select circuit configured to electrically couple one of the first even bit line and the second even bit line to the first latch, and to electrically couple one of the first odd bit line and the second odd bit line to the second latch.

Some embodiments of the present invention include a method for programming a memory cell, comprising: electrically coupling a first bit line to a first latch; electrically coupling a second bit line to a second latch, the second bit line being adjacent to the first bit line; electrically decoupling a third bit line from the first latch, the third bit line being adjacent to the second bit line; and programming adjacent memory cells in a same word line associated with the first bit line and the second bit line responsive to data stored in the first latch and the second latch.

BRIEF DESCRIPTION OF THE FIGURES

The accompanying FIGURES are included to provide a further understanding of the present invention, and are incorporated in and constitute a part of this specification. The drawings illustrate exemplary embodiments of the present invention and, together with the description, serve to explain principles of the present invention. In the FIGURES.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Hereinafter, exemplary embodiments of the present invention will be described in conjunction with the accompanying drawings.

An embodiment of a flash memory device of the present invention simultaneously programs at least two adjacent memory cells (for example, memory cells of the same row respectively coupled to even bit lines and odd bit lines, which are adjacent to each other) arranged in the same row. According to the above program method, a charge coupling effect is drastically reduced in memory cells adjacent to another memory cell that will be programmed. Therefore, the change of threshold voltage in the adjacent memory cells arranged in the same row where the selected memory cell is arranged significantly decreases. A structure of a flash memory device and a method of programming the same will be described in detail as follows.

Figure 3:
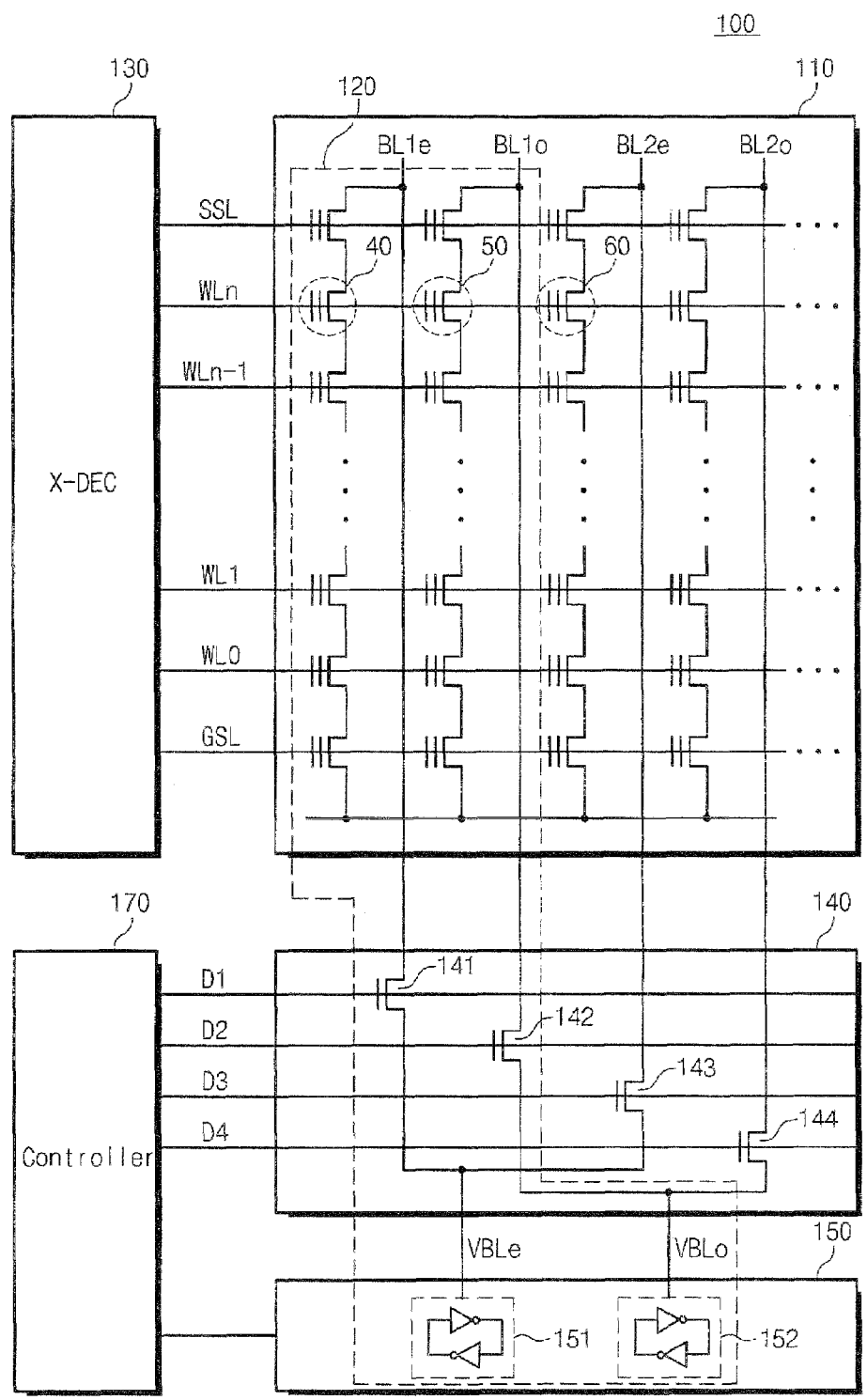
FIG. 3 shows a block diagram including a flash memory device according to an embodiment of the present invention.

FIG. 3 shows a block diagram including a flash memory device 100 according to an embodiment of the present invention. The flash memory device 100 is a NAND flash memory device with a single latch structure, which may be used for storing a single bit data, or storing a multi bit data in One-NAND memory having a buffer therein.

Figure 1:
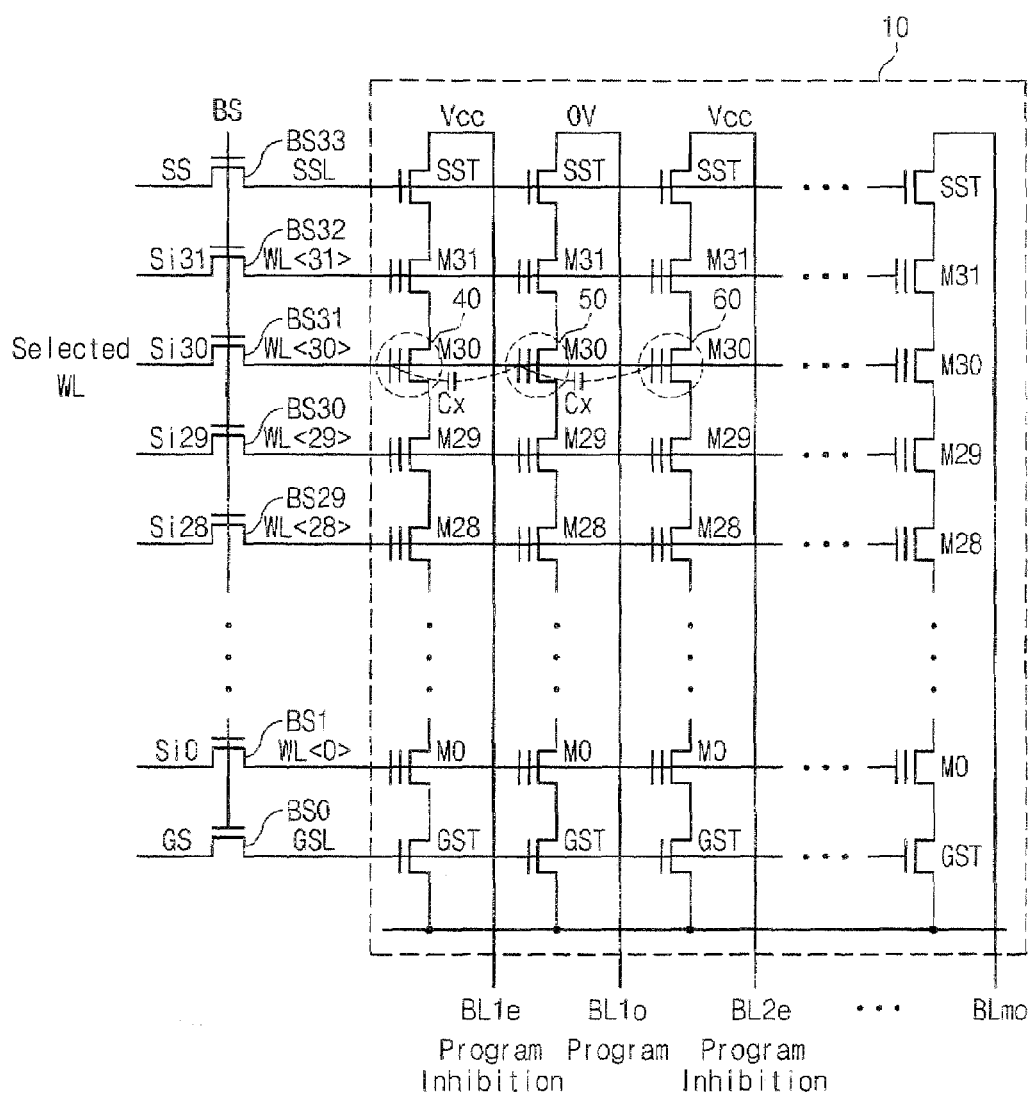
FIG. 1 shows a view of an array structure including a conventional flash memory device.
Figure 2:
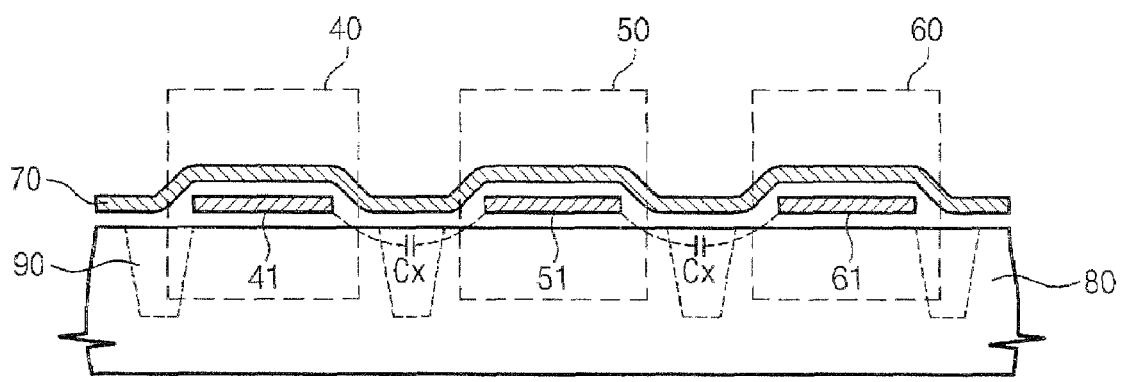
FIG. 2 shows a vertical sectional view including memory cells arranged in the same row of FIG. 1.

Referring to FIG. 3, the flash memory device 100 may include a memory cell array 110, a row decoder 130 (X-DEC in FIG. 3), a bit line select circuit 140, a page buffer circuit 150, and a controller 170. The memory cell array 110 may include a plurality of memory blocks. Only one memory block among the plurality of memory blocks is illustrated in FIG. 3. Each memory block may include a plurality of memory cells arranged on intersected regions of word lines WL0 to WLn and bit lines BL1e, BL1o, BL2e, BL2o, and so forth. The memory cells may include a string structure. The string structure of the memory cell was described in detail with reference to FIG. 1. Thus, the overlapping description will be omitted here for conciseness.

The rows of the memory cell array 110 may be driven by the row decoder circuit 130, and columns may be driven by a page buffer circuit 150. The page buffer circuit 150 may be controlled by a controller 170 and may operate as a write driver or a sense amplifier according to an operation mode. Due to the operation characteristics, the page buffer circuit 150 may be called a sense and latch circuit. The page buffer circuit 150 may include a plurality of page buffers 151, 152, and so forth, corresponding to the respective bit lines or a pair of bit lines. FIG. 3 illustrates page buffers 151 and 152 corresponding to adjacent two even bit lines BL1e and BL2e, or adjacent two odd bit lines BL1o and BL2o.

Still referring to FIG. 3, the adjacent two even bit lines BL1e and BL2e may be coupled to the page buffer 151 through an even virtual bit line VBLe. The adjacent two odd bit lines BL1o and BL2o may be coupled to the page buffer 152 through an odd virtual bit line VBLo. The even bit lines and odd bit lines are alternately arranged. A bit line structure coupled to each of page buffers 151, 152, and so forth, may vary within the scope of the present invention. A bit line switching operation of the bit line select circuit 140 may determine which bit line is selected among two bit lines coupled to the page buffers 151, 152, and so forth.

The bit line select circuit 140 may include a plurality of switching transistors 141 to 144 coupled to the bit lines BL1e, BL1o, BL2e, BL2o, and so forth. The switching transistors 141 to 144 may be turned on/off according to switching control signals D1 to D4 generated from the controller 170, in order to selectively activate the corresponding bit lines BL1e, BL1o, BL2e, and BL2o.

At least two adjacent bit lines among the bit lines BL1e, BL1o, BL2e, and BL2o may be activated and the activated bit lines may be electrically coupled to the page buffers 151 and 152. The switching transistors 141 and 142, or 143 and 144 coupled to the same page buffer (or, the same virtual bit lines)

may perform respectively opposite switching operations. For example, when the switching transistors 141 and 142 are turned on, the switching transistors 143 and 144 may be turned off. When the switching transistors 141 and 142 are turned off, the switching transistors 143 and 144 may be turned on. Consequently, when the adjacent bit lines BL1*e* and BL1*o* are electrically coupled to the corresponding page buffers 151 and 152, other bit lines BL2*e* and BL2*o* may be electrically decoupled from the page buffers 151 and 152 by the turned-off switching transistors 143 and 144. The memory cell coupled to the bit lines BL1*e* and BL1*o*, which are electrically coupled to the page buffers 151 and 152, may be simultaneously programmed according to the programming methods of FIGS. 5 through 7. In this case, charge coupling that occurs between the adjacent memory cells 40, 50, and 60 is drastically decreased compared to transitional methods. This will be described in more detail with reference to FIGS. 8 through 13. Referring to FIG. 3, a reference number 120 represents simultaneously programmed memory cells and a page buffer corresponding to the memory cells.

Figure 4:
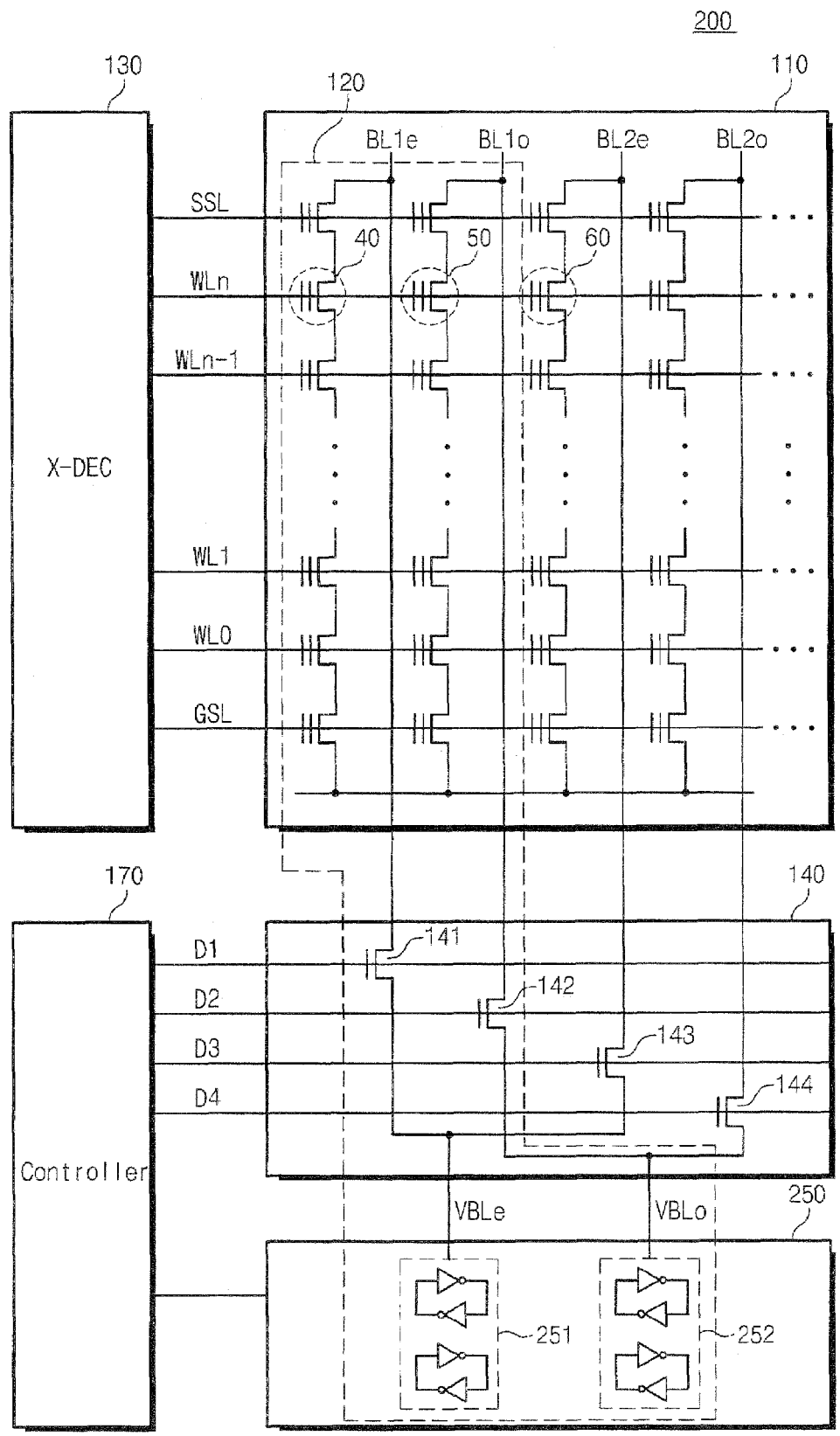
FIG. 4 shows a block diagram including a flash memory device according to another embodiment of the present invention.

FIG. 4 shows a block diagram including a flash memory device 200 according to another embodiment of the present invention, and illustrates a NAND flash memory device 200 with a dual latch structure. The flash memory device 200 with a dual latch structure may be used for storing multi bit data, and the dual latch structure may be modified and changed in diverse forms. For example, one latch among two latches is included in a page buffer, and the other may be disposed outside the page buffer.

Referring to FIG. 4, the flash memory device 200 is identical to that of FIG. 3 except that the page buffers 251 and 152 have a dual latch structure. Therefore, operations of the bit line select circuit 140, the controller 170, and the page buffer 250 may be substantially identical to those of FIG. 3. Like reference numbers refer to like elements throughout the drawings. Its detailed description will be omitted for conciseness.

Figure 5:
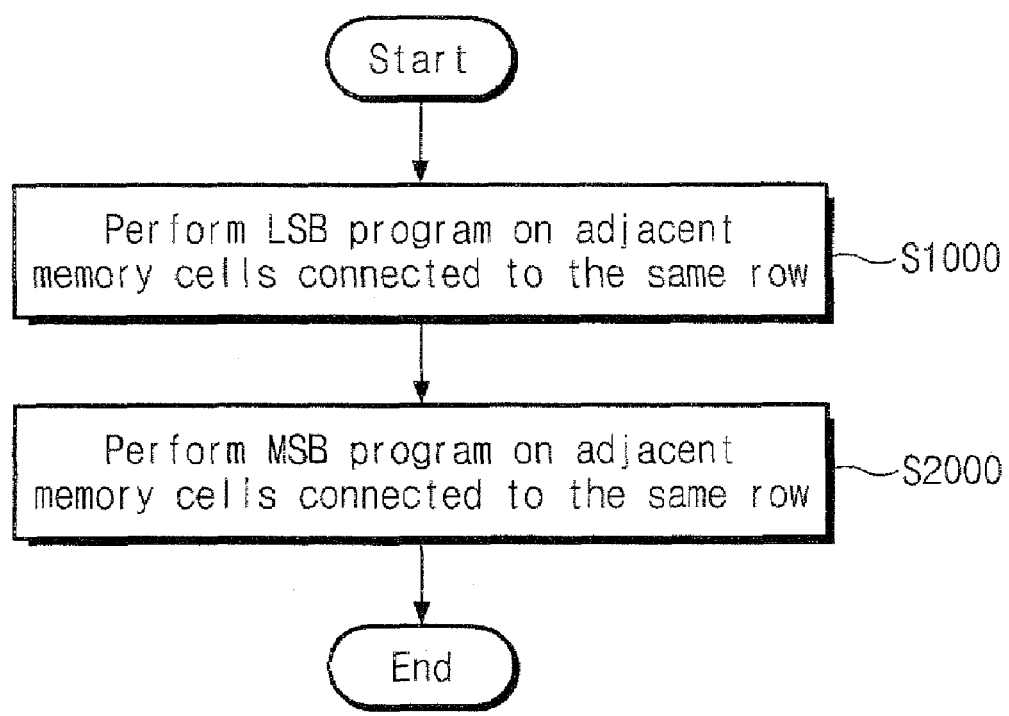
FIG. 5 shows a flowchart including a method of programming a flash memory device according to the present invention.

FIG. 5 shows a flowchart including a method of programming a flash memory device according to an embodiment of the present invention, FIG. 5 also illustrates a multi bit programming method that can prevent the change of a threshold voltage, which is caused by charge coupling between the memory cells 40, 50, and 60 arranged in the same row.

In a case of a multi bit program where one memory cell stores 2 bit data therein, the memory cell may be programmed to have one of states 11, 01, 10, and 00. However, the states are just examples, and may be modified in various forms. The memory cell having a state 11 is an erased memory cell. The threshold voltage of the memory cell having a state 01 is higher than that of the memory cell having a state 11. The threshold voltage of the memory cell having a state 10 is higher than that of the memory cell having a state 01. The threshold voltage of the memory cell having a state 00 is higher than that of the memory cell having a state 10. In the memory cell, one data bit (hereinafter, referred to as a Least Significant Bit, or LSB data bit) among two data bits is programmed first and then another data bit (hereinafter, referred to as a Most Significant Bit, or MSB data bit) is programmed last. The former is called an LSB program operation, and the latter is called an MSB program operation. Generally, the LSB program operation may be substantially similar to the single bit data program operation, but the MSB program operation may be substantially different from the LSB program operation.

Referring to FIG. 5, the programming method of the present invention may perform the LSB program on the memory cells 40 and 50 of the same row coupled to the plurality of adjacent bit lines (for example, BL1*e* and BL1*o*) in operation S1000. Then, the MSB program may be performed on the memory cells 40 and 50 in operation S2000. Although not illustrated in FIG. 5, adjacent bit lines (for example, BL1*e* and BL1*o*) may be selected for programming before performing the LSB program and MSB program operations. In this case, the adjacent bit lines (for example, BL1*e* and BL1*o*) may be activated. Therefore, a voltage difference does not occur between the memory cells 40 and 50 when a program voltage is applied to adjacent memory cells 40 and 50 through the word line.

According to the programming method of the present invention, charge coupling does not occur between the adjacent memory cells 40 and 50 coupled to the activated bit lines (for example, BL1*e* and BL1*o*). Contrarily, charge coupling occurs between the adjacent memory cell 60 and the selected memory cell 50 coupled to physically adjacent but deactivated bit lines (for example, BL2*e*). In this case, charge coupling for the memory cells coupled to the same row is not completely eliminated. However, when taking the arbitrarily selected memory cell 50 as a reference, charge coupling occurs on only one side of the memory cell 50, which occurs on both sides of the memory cell 50 in traditional methods. Consequently, the change of threshold voltage in the memory cell due to charge coupling is reduced by half.

Figure 6:
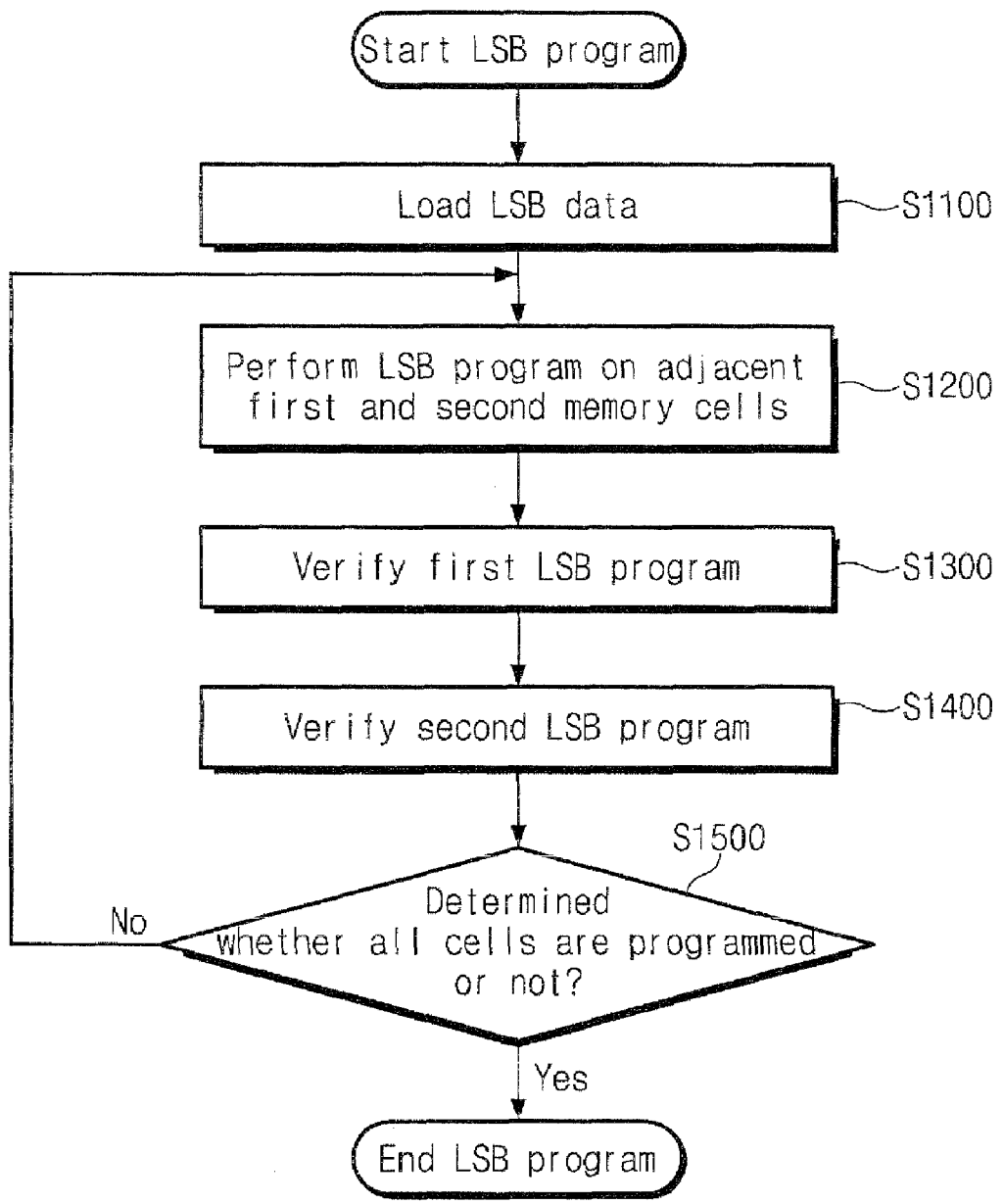
FIG. 6 shows a flowchart including an LSB program operation of FIG. 5.
Figure 7:
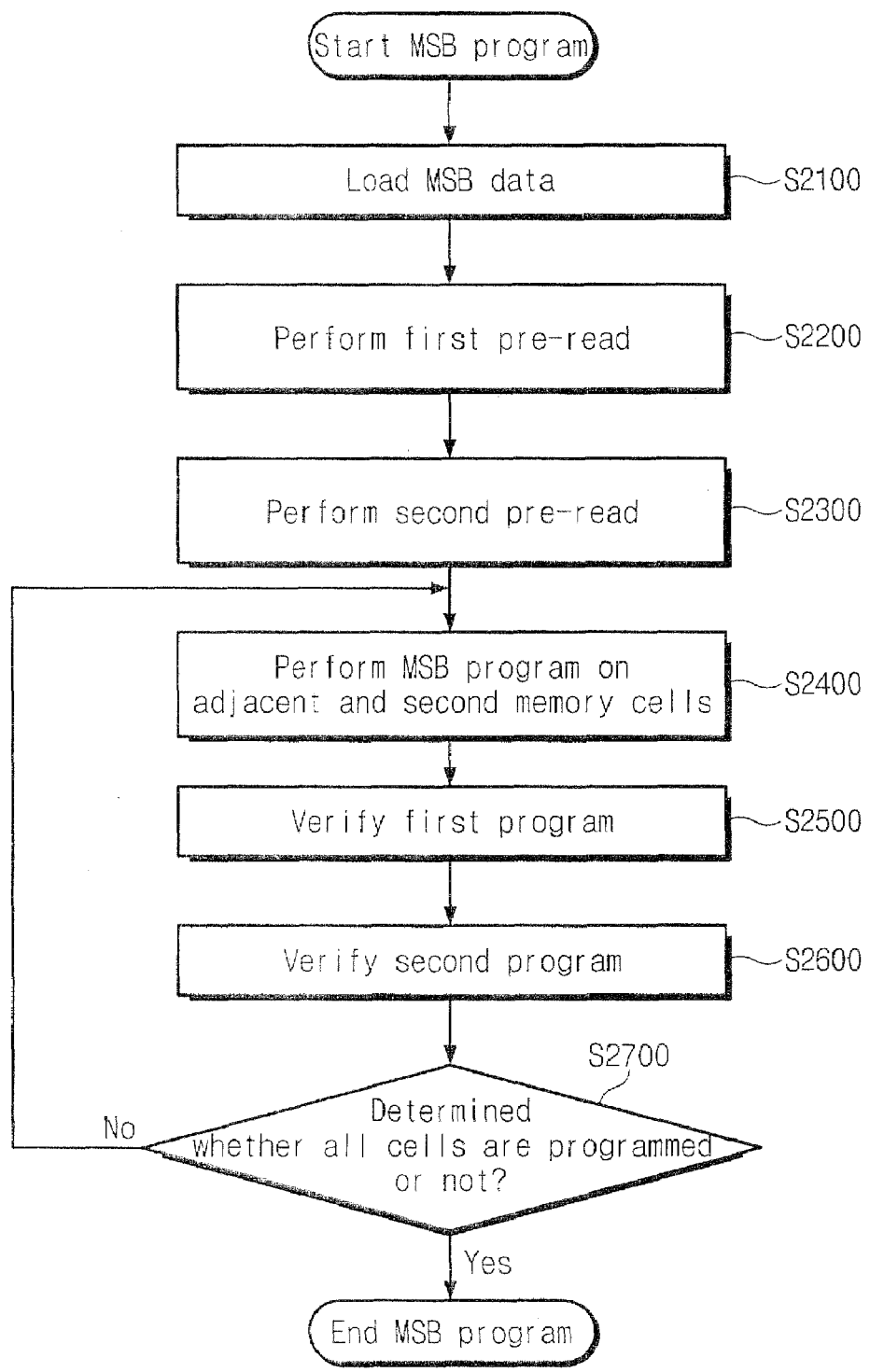
FIG. 7 shows a flowchart including an MSB program operation of FIG. 5.

FIG. 6 shows a flowchart including an LSB program operation S1000 of FIG. 5. FIG. 7 shows a flowchart including an MSB program operation S2000 of FIG. 5. FIGS. 6 and 7 illustrate an LSB program operation on two adjacent memory cells (hereinafter, referred to as first and second memory cells) coupled to the same row.

Referring to FIG. 6, when a host (not shown) requests an LSB program operation, a plurality of LSB data may be loaded into corresponding page buffers 151 and 152, respectively, according to the control of the controller 170 in operation S1100. The LSB data may be programmed into the first and second memory cells 40 and 50, which are adjacently arranged on the same row.

Thus, an LSB program may be performed on the first and second memory cells 40 and 50 by using the loaded LSB data in operation S1200. The first and second memory cells 40 and 50 may be respectively coupled to the adjacently disposed and activated first and second bit lines BL1*e* and BL1*o*. After a program operation is performed on the adjacent first and second memory cells 40 and 50, a program verify process may be performed on one of the programmed memory cells 40 and 50, i.e., the first memory cell 40 in operation S1300. Then, a program verify process may be performed on the second cell 50 in operation S1400. In operations S1300 and 1400, it is determined whether the first and second memory cells 40 and 50 have a required threshold voltage or not.

Next, it may be determined whether all the memory cells 40 and 50 are programmed or not based on the verification result in operation S1500. If all the memory cells 40 and 50 are not programmed in operation S1500, it may return to operation S1200. If all the memory cells 40 and 50 are programmed in operation S1500, it may terminate.

The LSB and MSB program operations for a region 120 in FIGS. 3 and 4 are described as an example. However, the example is used for understanding an embodiment of the present invention, and the number of simultaneously programmable adjacent memory cells may vary. The number of program verify operations may vary as frequently as the number of simultaneously programmable adjacent memory cells vary. The LSB program operation of the multi bit flash memory device may be applied to the single bit program operation.

Referring to FIG. 7, when the host requests the MSB program operation, a plurality of MSB data may be loaded into the corresponding page buffer 151 and 152. Next, a first pre-read operation S2200 and a second pre-read operation S2300 may be performed to read states of the previously programmed data. In the first pre-read operation, the program state of the first memory cell 40 may be confirmed. In the second pre-read operation, the program state of the second memory cell 50 may be confirmed.

The previously performed program state may be confirmed in operations S2200 and S2300, and then the MSB programs for the first and second memory cells 40 and 50 may be simultaneously performed based on the program state and the MSB data loaded in the page buffers 151 and 152 in operation S2400. In operations S2500 and S2600, program verify operations may be sequentially performed on the memory cells 40 and 50. In operations S2500 and S2600, it may be sequentially determined whether the programmed first and second memory cells 40 and 50 have a required threshold voltage or not. Next, it may be determined whether all the memory cells 40 and 50 are successfully programmed or not, based on the verification result in operation S2700. If all the memory cells 40 and 50 are not programmed according to the determination result, it may return to operation S2400; and if all the memory cells 40 and 50 are successfully programmed, it may terminate.

The MSB program method for one of states 01, 10, and 00 is described above as an example. As it is well known to those skilled in the art, the operation order of MSB 01, MSB10, and MSB00 programs may vary in diverse forms.

FIGS. 8 through 12 show views of the result in addressing page according to a program method of an embodiment of the present invention.

Figure 8:
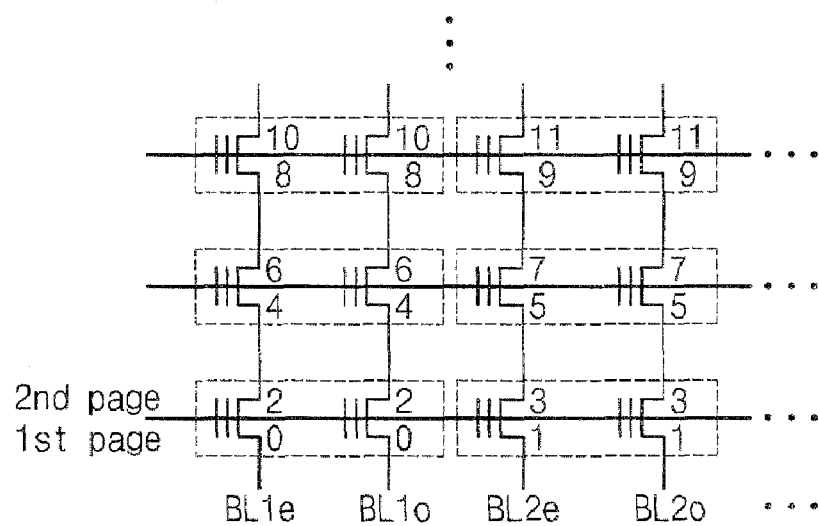
FIGS. 8 and 9 show views of the result in addressing a page used for a programming method according to embodiments the present invention.
Figure 9:
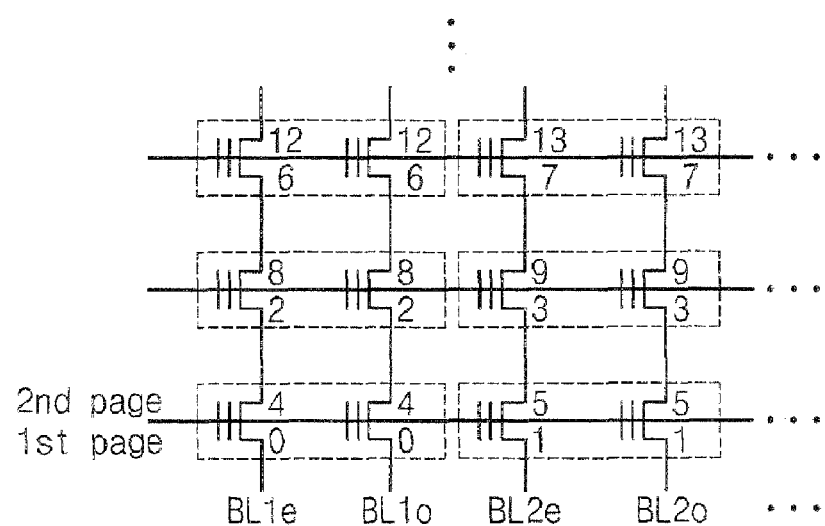

Referring to FIGS. 8 and 9, at least two memory cells coupled to the same row may have the same page address. A program or read operation of the NAND flash memory may be performed by a page unit, and an erase operation of the programmed data may be performed by a block unit. The block unit may include a plurality of pages. Therefore, adjacent memory cells having the same address may be simultaneously programmed. The page addressing method of FIGS. 8 and 9 may vary.

Figure 10:
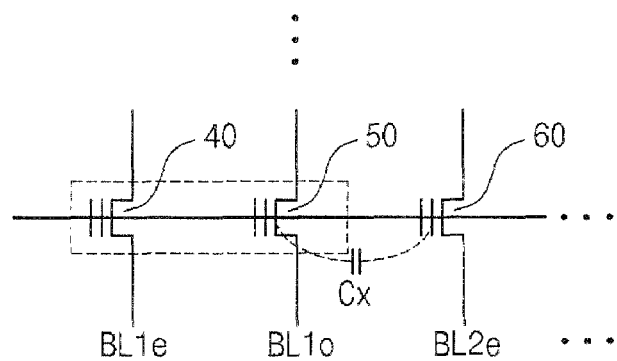
FIG. 10 shows a view of program properties in memory cells according to page addressing of FIGS. 8 and 9.

FIG. 10 shows a view of program properties in memory cells according to page addressing of FIGS. 8 and 9. Referring to FIGS. 8 through 10, when at least two adjacent memory cells coupled to the same row are simultaneously programmed, parasitic capacitance Cx does not occur between the simultaneously programmed memory cells 40 and 50, and parasitic capacitance Cx occurs between memory cells 50 and 60 that are not simultaneously programmed. If memory cells coupled to the same row are not simultaneously programmed but programmed respectively, charge coupling occurs on both sides of the selected memory cell. Charge coupling that occurs during a program operation according to a program method of the present invention is reduced by half compared to transitional methods. If the number of memory cells that are simultaneously programmed among adjacent memory cells coupled to the same row increases, charge coupling occurring between the memory cells can be even more reduced.

Figure 11:
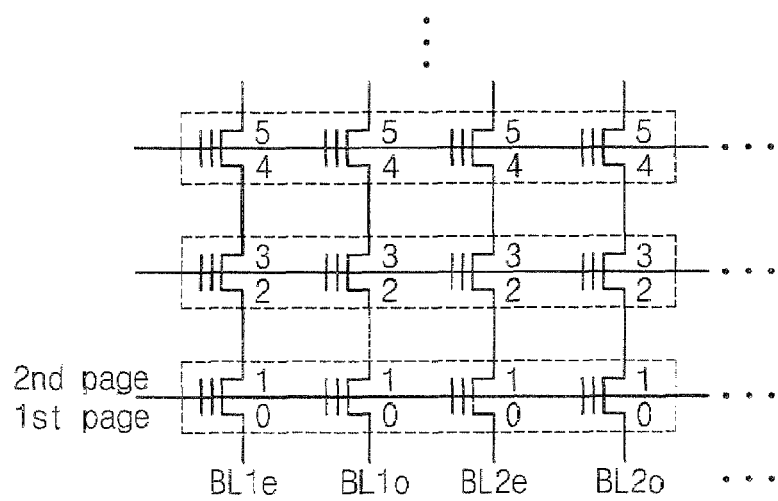
FIGS. 11 and 12 show views of the result in addressing a page used for a programming method according to embodiments the present invention.
Figure 12:
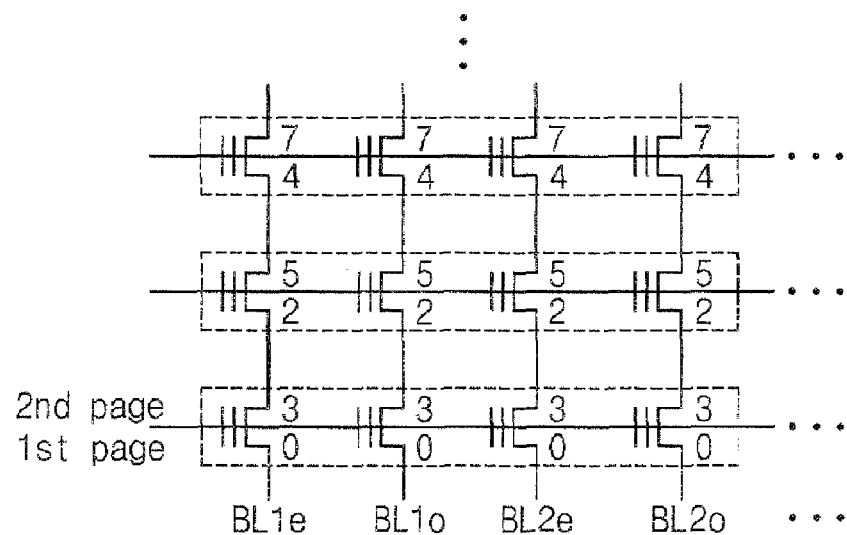

Referring to FIG. 11 and 12, the number of memory cells with the same page address among memory cells coupled to the same row is not limited to two, and may be a natural number n. The n number of adjacent memory cells with the same page address in the same row may be programmed simultaneously, and the n number of simultaneously programmed memory cells may vary, and may correspond with at least one page buffer. For example, in FIG. 11, a 1st page may correspond with page address 0, which may include n number of adjacent memory cells, each having a LSB comprising the same page address 0. Similarly, a 2nd page may correspond with page address 1, which may include the n number of adjacent memory cells, each having a MSB comprising the same page address 1.

Figure 13:
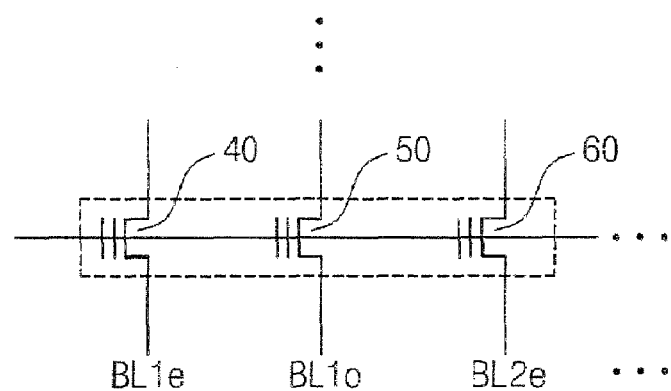
FIG. 13 shows a view of program properties in memory cells according to page addressing of FIGS. 11 and 12.

FIG. 13 shows a view of program properties in memory cells according to page addressing of FIGS. 11 and 12. Referring to FIGS. 11 through 13, a parasitic capacitance Cx does not occur between the simultaneously programmed memory cells 40, 50, and 60. As the number of simultaneously programmed memory cells increases, charge coupling between adjacent memory cells coupled to the same row is reduced. Therefore, according to a structure of the present invention, which may simultaneously program the n number of adjacent memory cells coupled to the same row, charge coupling, which occurs between adjacent memory cells arranged in the same row during a program operation, may reduce the change of a threshold voltage. Accordingly, an additional reprogram operation is unnecessary to correct the change of a threshold voltage of adjacent memory cells, which is caused by charge coupling. The change of a threshold voltage, which is caused by charge coupling that occurs between adjacent memory cells arranged in the same row, can be reduced and a program operation for corresponding memory cells can be performed at high speed without a program operation or an additional circuit.

According to various embodiments of the present invention, the change of a threshold voltage can be reduced without a program operation or an additional circuit. The change of a threshold voltage is caused by charge coupling that occurs between adjacent memory cells arranged in the same row. Consequently, an additional processor for correcting a threshold voltage in adjacent memory cells is omitted such that a program operation for a corresponding memory cell can be performed at higher speeds.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A flash memory device comprising:
   a memory array intersected by a first even bit line, a first odd bit line adjacent to the first even bit line, a second even bit line, and a second odd bit line adjacent to the second even bit line, and a plurality of word lines;
   a page buffer circuit including a first latch coupled to an even virtual bit line and a second latch coupled to an odd virtual bit line, the even virtual bit line being coupled to the first and second even bit lines, and the odd virtual bit line being coupled to the first and second odd bit lines; and
   a select circuit configured to electrically couple one of the first even bit line and the second even bit line to the first latch, and to electrically couple one of the first odd bit line and the second odd bit line to the second latch.

2. The flash memory device of claim 1, wherein the select circuit is configured to electrically decouple one of the first even bit line and the second even bit line from the first latch, and to electrically decouple one of the first odd bit line and the second odd bit line from the second latch.

3. The flash memory device of claim 2, wherein a first memory cell of the first even bit line and a second memory cell of the first odd bit line are simultaneously programmed.

4. The flash memory device of claim 3, wherein a Least Significant Bit (LSB) of the first memory cell and the LSB of the second memory cell are simultaneously programmed, and wherein a Most Significant Bit (MSB) of the first memory cell and the MSB of the second memory cell are simultaneously programmed.

5. The flash memory device of claim 4, wherein the LSB of the first memory cell and the LSB of the second memory cell comprise a first page address, and wherein the MSB of the first memory cell and the MSB of the second memory cell comprise a second page address.

6. The flash memory device of claim 1, wherein the page buffer circuit simultaneously programs adjacent memory cells on a same word line.

7. The flash memory device of claim 6, wherein the adjacent memory cells on the same word line have a same page address.

8. A method for programming a memory cell, comprising:
electrically coupling a first bit line to a first latch;
electrically coupling a second bit line to a second latch, the second bit line being adjacent to the first bit line;
electrically decoupling a third bit line from the first latch, the third bit line being adjacent to the second bit line; and
programming adjacent memory cells in a same word line associated with the first bit line and the second bit line responsive to data stored in the first latch and the second latch.

9. The method of claim 8, wherein programming the adjacent memory cells comprises simultaneously programming the adjacent memory cells, and wherein the adjacent memory cells in the same word line have a same page address.

10. The method of claim 8, wherein a Least Significant Bit (LSB) of each of the adjacent memory cells are simultaneously programmed, and wherein a Most Significant Bit (MSB) of each of the adjacent memory cells are simultaneously programmed.

11. The method of claim 10, wherein the LSB of each of the adjacent memory cells comprise a first page, and wherein the MSB of each of the adjacent memory cells comprise a second page.

12. A method of programming a memory cell, comprising:
selecting a plurality of bit lines arranged adjacently; and
simultaneously programming n adjacent memory cells of a word line, wherein each memory cell is associated with one of the plurality of bit lines,
wherein programming includes performing a Least Significant Bit (LSB) program operation on each of the n adjacent memory cells in the same word line, and performing a Most Significant Bit (MSB) program operation on each of the n adjacent memory cells in the same word line.

13. The method of claim 12, wherein selecting the plurality of bit lines includes electrically coupling the plurality of bit lines to at least one page buffer, wherein programming includes loading data from the at least one page buffer to the n adjacent memory cells, and wherein the n adjacent memory cells comprise a same page address.

14. A method of programming a memory cell, comprising:
selecting a plurality of bit lines arranged adjacently; and
simultaneously programming n adjacent memory cells of a word line, wherein each memory cell is associated with one of the plurality of bit lines,
wherein selecting the plurality of bit lines includes electrically coupling the plurality of bit lines to at least one page buffer, wherein programming includes loading data from the at least one page buffer to the n adjacent memory cells, and wherein the n adjacent memory cells comprise a same page address,
wherein programming includes performing a Least Significant Bit (LSB) program operation on each of the n adjacent memory cells in the same word line, and performing a Most Significant Bit (MSB) program operation on each of the n adjacent memory cells in the same word line.

15. The method of claim 14, wherein performing the LSB program operation comprises:
loading LSB data into the at least one page buffer;
using the loaded LSB data to perform the LSB program operation on the n adjacent memory cells; and
sequentially performing an LSB program verify operation on the programmed n adjacent memory cells.

16. The method of claim 15, wherein performing the LSB program operation comprises simultaneously programming the n adjacent memory cells.

17. The method of claim 16, wherein performing the MSB program comprises:
loading MSB data into the at least one page buffer;
sequentially confirming program states of the LSB program operation for the n adjacent memory cells;
performing an MSB program operation on the n adjacent memory cells responsive to the loaded MSB data and the confirmed LSB program operation; and
sequentially performing an MSB program verify operation on the programmed n adjacent memory cells.

18. The method of claim 17, wherein performing the MSB program operation comprises simultaneously programming the n adjacent memory cells, wherein the LSB data of the n adjacent memory cells comprise a first memory page, and the MSB data of the n adjacent memory cells comprise a second memory page.

19. The method of claim 18, wherein performing the MSB program operation comprises verifying that all of the n adjacent memory cells are successfully programmed, and terminating the MSB program operation responsive to the verification.

20. A flash memory device comprising:
a memory array including n adjacent memory cells, each of the n adjacent memory cells having a least significant bit and a most significant bit; and
a circuit structured to simultaneously program each of the least significant bits of the n adjacent memory cells, the least significant bits corresponding to a first memory page, the circuit being structured to simultaneously program each of the most significant bits of the n adjacent memory cells, the most significant bits corresponding to a second memory page.

* * * * *